United States Patent
Shimizu

[19]
[11] Patent Number: 6,060,711
[45] Date of Patent: May 9, 2000

[54] CHARGED-PARTICLE OPTICAL SYSTEMS AND PATTERN TRANSFER APPARATUS COMPRISING SAME

[75] Inventor: Hiroyasu Shimizu, Kawasaki, Japan

[73] Assignee: Nikon Corporation, Tokyo, Japan

[21] Appl. No.: 09/014,004

[22] Filed: Jan. 27, 1998

[30] Foreign Application Priority Data

Jan. 27, 1997 [JP] Japan .................................. 9-012615
Jun. 30, 1997 [JP] Japan .................................. 9-174399

[51] Int. Cl.$^7$ .................................................. H01J 37/14
[52] U.S. Cl. .................................. 250/358; 250/396 ML; 250/492.2
[58] Field of Search ........................ 250/396 K, 396 ML, 250/398, 492.2

[56] References Cited

U.S. PATENT DOCUMENTS

| | | | |
|---|---|---|---|
| 3,876,883 | 4/1975 | Broers et al. | 250/398 |
| 5,136,167 | 8/1992 | Langner et al. | 250/398 |
| 5,466,549 | 11/1995 | Yamada | 250/492.3 |
| 5,708,274 | 1/1998 | Langner et al. | 250/396 ML |
| 5,747,814 | 5/1998 | Gordon et al. | 250/398 |
| 5,747,819 | 5/1998 | Nakasuji et al. | 250/398 |
| 5,770,863 | 6/1998 | Nakasuji | 250/396 R |

OTHER PUBLICATIONS

Zhong–wei Chen et al., "The Optical Properties of 'Swinging Objective Lens' in a Combined Magnetic Lens and Deflection System With Superimposed Field," Optik 64, pp. 341–347 (1983).

H.C. Pfeiffer et al., "Advanced Deflection Concept for Large Area, High Resolution E–Beam Lithography," J. Vac. Sci. Technol. 19, pp. 1058–1063 (1981).

Primary Examiner—Bruce C. Anderson
Attorney, Agent, or Firm—Klarquist Sparkman Campbell Leigh & Whinston, LLP

[57] ABSTRACT

Charged-particle beam pattern transfer apparatus and charged-particle beam optical systems are disclosed. A representative charged-particle beam pattern transfer apparatus comprises a projection lens that images patterns from a mask onto a substrate. To reduce off-axis image aberrations, especially anisotropic coma and astigmatism, deflectors are provided that produce a magnetic field such that the effective optical axis of the lenses is along a straight line that is tilted with respect to the mask and the substrate. Focus correctors are provided that produce a magnetic field that corrects image focus. Mathematical descriptions of these magnetic fields are disclosed. With such magnetic fields, the charged-particle beam that irradiates a central region of a subfield on the mask propagates along a straight-line axis through the projection lens, reducing deflection aberration and improving image quality.

28 Claims, 4 Drawing Sheets

CHARGED-PARTICLE OPTICAL SYSTEMS AND PATTERN TRANSFER APPARATUS COMPRISING SAME

FIELD OF THE INVENTION

The invention pertains to charged-particle beam optical apparatus and charged-particle beam lithographic apparatus.

BACKGROUND OF THE INVENTION

With reference to FIG. 4, a conventional electron-beam apparatus comprises an electron gun (not shown in FIG. 4) that emits an electron beam EB along an axis AX. The electron beam EB forms a crossover CO1 and is then focused by a condenser lens 50 and deflected by a deflector 51. The electron beam then irradiates a mask 1 that defines a pattern to be transferred to a sensitized substrate 5. The sensitized substrate 5 is generally a semiconductor wafer or a glass plate that is coated with an electron-beam-sensitive resist.

The electron beam EB is selectively deflected by the deflector 51 to exemplary deflected electron beams $EB_1$, $EB_2$, $EB_3$. The beams $EB_1$, $EB_2$, $EB_3$ irradiate portions of an exemplary subfield 1a on the mask 1. The beam $EB_1$ corresponds to a deflection of the electron beam EB such that the center of the subfield 1a is irradiated. The deflected beams $EB_2$, $EB_3$ irradiate respective perimeter portions of the subfield 1a. The electron beam EB is shaped so that rectangular portions of the subfield 1a are irradiated by the respective beams $EB_1$, $EB_2$, $EB_3$.

After transmission by the mask 1, the electron beam EB is directed to the sensitized substrate 5 by a first projection lens 3 and a second projection lens 4. The first projection lens 3 consists of deflectors 31, 32, and focus correctors 35, 36 and the second projection lens 4 consists of deflectors 33, 34, and focus correctors 37, 38. The lenses 3, 4 image the subfield 1a onto the sensitized substrate 5.

The mask 1 and the sensitized substrate 5 are retained by a mask stage and a wafer stage, respectively (not shown in FIG. 4). The mask and wafer stages move continuously in opposite directions while the electron beam EB is deflected by the deflector 51 perpendicular to and along the direction of motion of the stages. The sensitized substrate 5 is exposed to the patterns from the entire mask 1 by sequentially exposing the mask to the pattern in each of a plurality of subfields similar to the subfield 1a. If the subfields are large, then a large area of the sensitized substrate 5 can be irradiated by at once and the time required to expose the sensitized substrate 5 can be reduced.

As shown in FIG. 4, the deflector 41 deflects the electron beam EB toward the axis AX to an aperture 6 placed at a crossover CO2. The electron beam EB is then deflected by the deflector 42 so that the electron beam EB propagates parallel to the axis AX. The projection lenses 3, 4 form a so-called variable-axis lens (VAL), and the deflectors 31–34 are VAL deflectors and the focus correctors 35–38 are VAL focus correctors. If $B_o(z)$ is the axial component of the magnetic field on the axis AX produced by the projection lenses 3, 4 and a is the distance from the axis AX to the center of the subfield 1a, then the magnetic field $B_{rVAL}$ produced by the VAL deflectors 31–34 is given by Equation 1:

$$B_{rVAL} = K_1 a \frac{dB_o(z)}{dz} \quad (1)$$

where $K_1$ is a constant. The VAL focus correctors 35–38 produce a magnetic field $B_{zVAL}$ given by Equation 2:

$$B_{zVAL} = K_2 a^2 \frac{d^2 B_o(z)}{dz^2} \quad (2)$$

where $K_2$ is a constant. The magnetic fields $B_{rVAL}$ and $B_{zVAl}$ shift the effective optical axis away from and parallel to the axis AX. As a result, the electron beam EB propagates along the effective axis of the projection lenses 3, 4, reducing off-axis aberrations.

Conventional charged-particle beam exposure apparatus have several significant limitations. If the deflection of the electron beam EB by the deflector 51 is large, then the deflection of the electron beam EB by the deflectors 41, 42 is also large. These large deflections introduce aberrations into the image of the subfield 1a. Because the deflection by the deflector 51 must be kept small to preserve image resolution, the size of the subfield 1a is correspondingly small and throughput is limited.

SUMMARY OF THE INVENTION

The present invention provides a charged-particle beam pattern transfer apparatus that projects well-focused images of a mask onto a substrate, even off-axis. The invention also provides a charged-particle optical system that reduces image blur caused by deflection aberrations.

A charged-particle beam apparatus for imaging patterns on a mask onto a substrate according to an embodiment of the invention comprises a charged-particle source that produces a charged-particle beam that irradiates a subfield or other region of a mask. The apparatus further comprises a projection lens that has a lens axis. The projection lens receives the charged-particle beam after transmission by the mask and images the irradiated region of the mask onto the substrate. The apparatus further comprises a deflection unit that produces a magnetic field so that the charged-particle beam propagates along a straight-line axis from the mask to the substrate.

In an alternative embodiment, the straight-line axis is tilted with respect to the lens axis of the projection lens. In addition, an irradiation deflector is provided, situated so as to deflect the charged-particle beam so that the charged-particle beam is incident at an angle to the mask.

Yet another embodiment of the invention provides a charged-particle beam apparatus comprising a first deflector situated between the mask and the projection lens so as to deflect the beam along the straight-line axis and a second deflector situated between the substrate and the projection lens so as to deflect the beam away from the straight-line axis to the substrate. The charged-particle beam propagates along the straight-line axis between the first and second deflectors.

In this embodiment, the second deflector determines the angle of incidence of the charged-particle beam to the substrate. The first and second deflectors permit the angle of incidence of the charged-particle beam on the mask and the substrate to be independently adjusted. In an alternative embodiment, an irradiation deflector directs the charged-particle beam along the straight-line axis through the mask and the first deflector is omitted.

In another embodiment of a charged-particle beam apparatus, the irradiation deflector is situated so as to a deflect the beam so that the beam is incident at an angle to the mask and incident at the same angle to the substrate.

In a further embodiment of the invention, the deflection unit provides a magnetic field described by a mathematical expression. A cylindrical coordinate system is defined whose z-axis is the lens axis and such that the lens axis and the straight-line axis intersect at a position $z_a$ the mask is located along the lens axis at a position $z_i$, and z is an axial coordinate measured along the lens axis from the mask. Representing the axial on-axis magnetic field produced by the projection lens as $B_o(z)$, the magnetic field produced by the deflection unit is proportional to:

$$\left[\frac{a}{z_i - z_a}\right] B_o(z) + \left[\frac{a(z - z_a)}{2(z_i - z_a)}\right] \frac{dB_o(z)}{dz}.$$

In another embodiment, an additional magnetic field component is produced by a focus corrector. The focus corrector is situated between the mask and the substrate and produces an axial magnetic field proportional to:

$$\frac{-a^2}{2(z_i - z_a)^2}\left[B_o(z) + 3(z - z_a)\frac{dB_o(z)}{dz} + (z - z_a)^2 \frac{d^2 B_o(z)}{dz^2}\right].$$

A charged-particle optical system for deflecting a charged-particle beam transmitted by a mask to a substrate is provided. The optical system comprises a first deflector that receives the charged-particle beam from the mask. A projection lens is provided that images the mask onto the substrate. A second deflector receives and deflects the beam received from the projection lens. The optical system further comprises a deflection unit situated between the mask and the substrate that produces a magnetic field such that the beam propagates along a straight line from the first deflector to the second deflector.

Alternatively, the charged-particle beam optical system comprises a principal deflection plane that is substrate-wise of a most substrate-wise principal plane of the projection lens. Alternatively, the charged-particle beam optical system further comprises a principal deflection plane located between the mask and a most mask-wise principal plane of the projection lens. Further alternatively, the charged-particle beam optical system comprises a principal deflection plane that is substrate-wise of a most substrate-wise principal plane of the projection lens.

The invention further provides methods for imaging patterns from a mask onto a substrate. A preferred embodiment of the method comprises irradiating the mask with a charged-particle beam, forming an image of the mask on the substrate, and deflecting the beam so that the beam propagates along a straight-line axis from the mask to the substrate.

The foregoing and other features and advantages of the invention will become more apparent from the following detailed description of example embodiments which proceeds with reference to the accompanying drawings.

DETAILED DESCRIPTION

Example Embodiment 1

Figure 1:
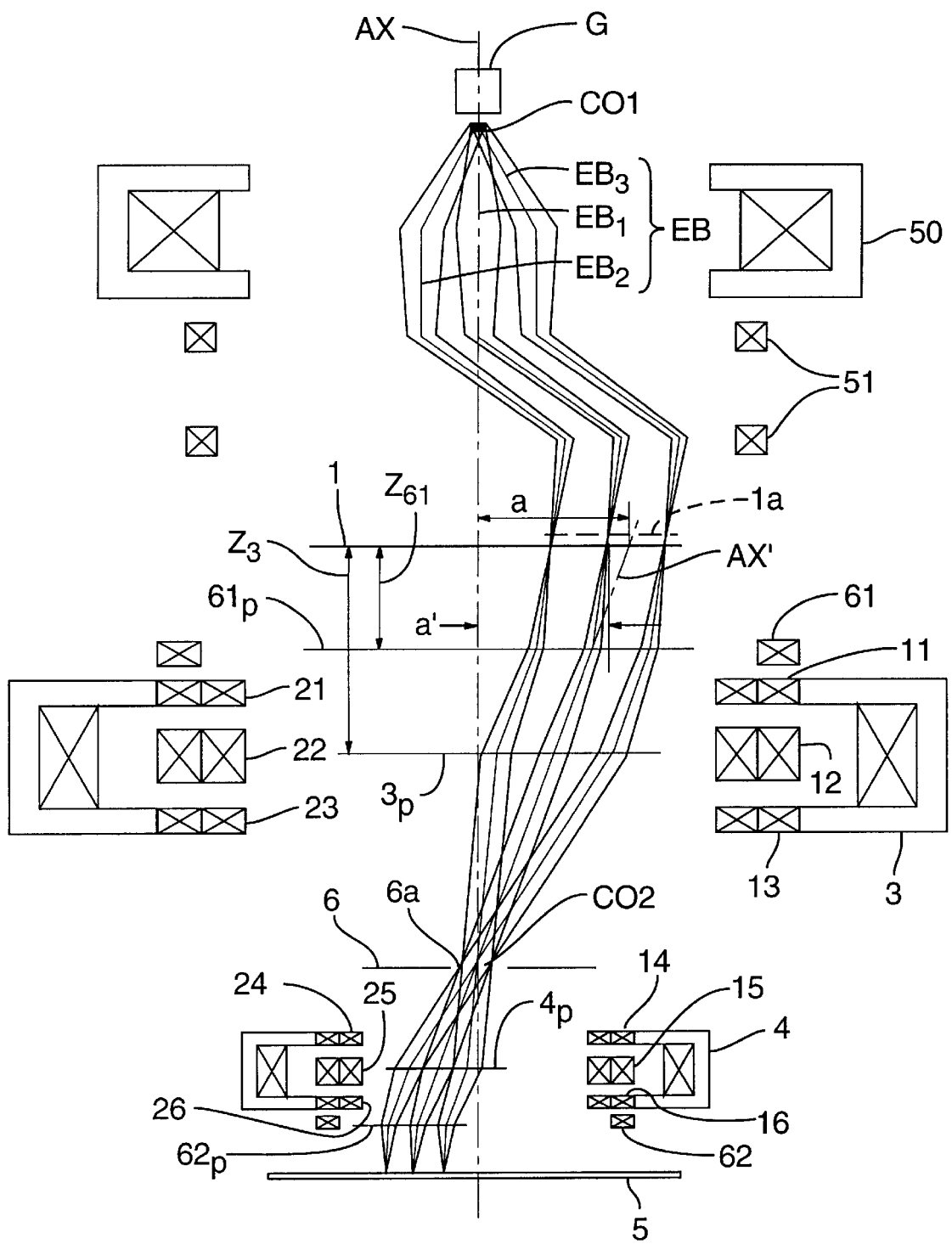
FIG. 1 is an elevational sectional view of a charged-particle beam pattern transfer apparatus according to Example Embodiment 1 of the invention.
Figure 4:
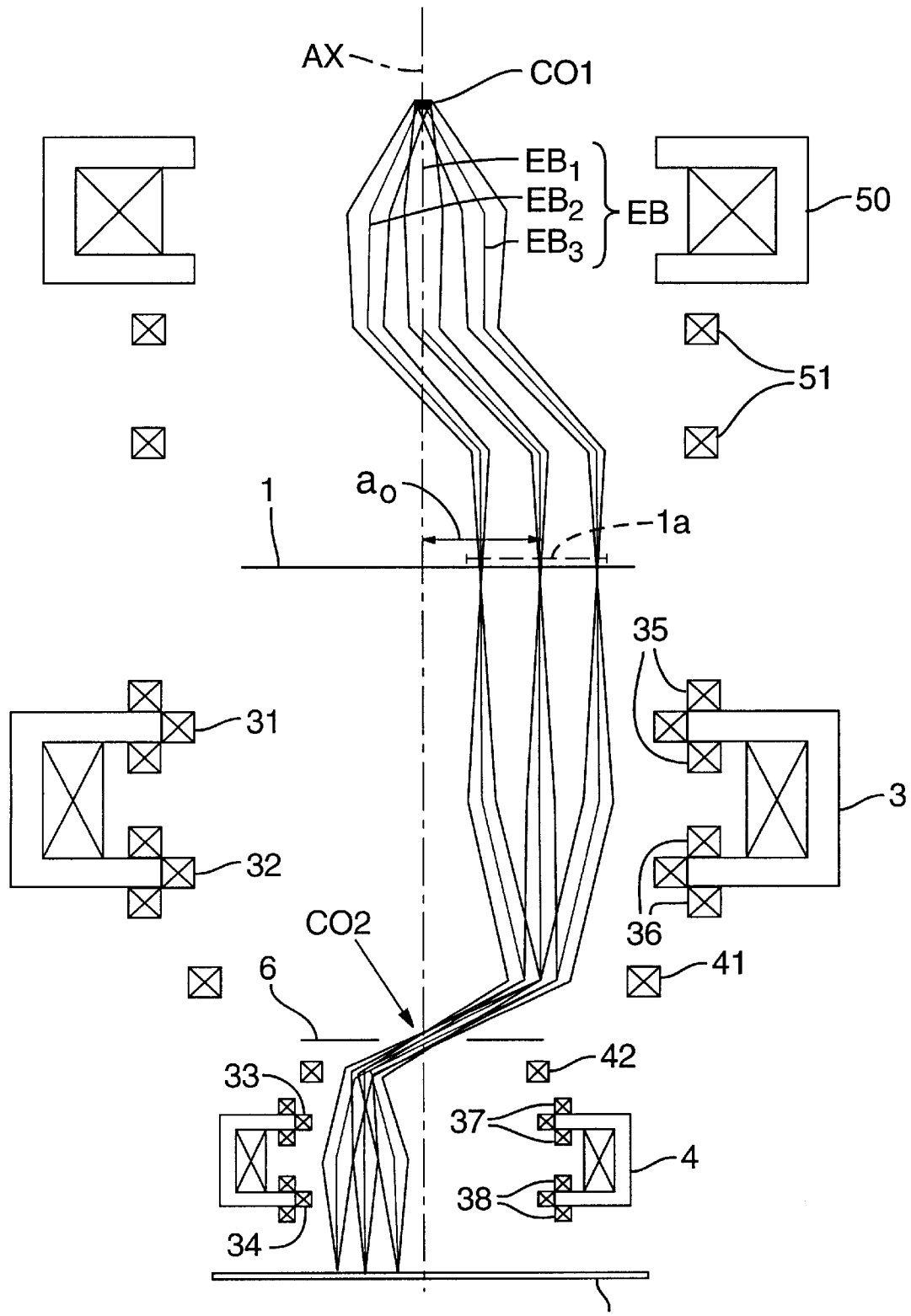
FIG. 4 is an elevational sectional view of a conventional charged-particle beam pattern transfer apparatus.

With reference to FIG. 1, Example Embodiment 1 of an electron-beam pattern transfer apparatus comprises an electron gun G that forms an electron beam EB. The beam EB propagates along an axis AX and forms a crossover CO1. A condenser lens 50 focuses the beam onto a subfield 1a of a mask 1. For convenience, a first position along the axis AX closer to the mask 1 than a second position is referred to herein as being "mask-wise" of the second position. In addition, FIGS. 1, 4 use the same reference numerals for similar components.

Irradiation deflectors 51 selectably deflect the electron beam EB. Exemplary portions $EB_1$, $EB_2$, $EB_3$ of the electron beam EB are deflected away from the axis AX and then toward the axis AX by the deflectors 51 and irradiate a subfield 1a of a mask 1. For convenience, the exemplary portions $EB_1$, $EB_2$, $EB_3$ are referred to herein as beams $EB_1$, $EB_2$, $EB_3$, respectively. The beam $EB_1$ irradiates a central region of the subfield 1a that is a distance a' from the axis AX while the beams $EB_2$, $EB_3$ irradiate perimeter regions of the subfield 1a.

From the mask 1, the beam EB propagates to a first deflector 61 that deflects the beam EB so that the exemplary beam $EB_1$, propagates along an axis AX'. A projection lens 3 focuses the beam EB to a crossover CO2 at an aperture plate 6. The beam EB then propagates to a lens 4 that images the irradiated portion of the subfield 1a onto a sensitized substrate 5. The projection lenses 3, 4 have axes that are along the axis AX. For convenience, a first position along the axis AX closer to the substrate 5 than a second position is referred to herein as being "substrate-wise" of the second position.

Focus correctors 21, 22, 23 are placed near the lens 3. The lens 3 directs the exemplary beams $EB_2$, $EB_3$ to an aperture 6a in the aperture plate 6. A deflection unit is provided that comprises deflectors 11–16. The deflectors 11–13 are placed in proximity to the lens 3 while the deflectors 14–16 are placed in proximity to the lens 4. The deflection unit (i.e., deflectors 11–16) deflects the beam EB so that the exemplary beam $EB_1$ propagates along an axis AX' from the mask 1 to the substrate 5.

Focus correctors 24, 25, 26 are placed in proximity to the lens 4. The beam EB is directed by the lens 4 and a second deflector 62 so that the beam EB strikes the substrate 5 at a selected angle of incidence. The first deflector 61 and the second deflector 62 are arranged to produce opposing deflections so that their deflection aberrations approximately cancel. As is shown in FIG. 1, the exemplary beam $EB_1$ propagates along an axis AX' from the first deflector 61 to the second deflector 62.

The magnetic fields that deflect and focus the beam EB are conveniently described with reference to a cylindrical coordinate system in which the z-axis is the axis AX. The cylindrical coordinates (r,θ,z) are defined so that r is measured perpendicular to the z-axis and θ is an angle measured in a plane perpendicular to the z-axis. If $z_a$ is defined as the z-axis position at which the axes AX, AX' intersect (the position of the aperture 6), $z_m$ is defined as the z-axis position of the mask 1, a is defined as the distance from the axis AX to the intersection of the axis AX' with the subfield 1a, and $B_o(z)$ is defined as the axial component of the on-axis magnetic field produced by the lenses 3, 4, then the deflection unit (i.e., deflectors 11–16) produces a component $B_r$ of magnetic field on the axis AX given by Equation 3:

$$B_r(z) = K' \left[ \frac{a}{z_m - z_a} \right] B_o(z) + K' \left[ \frac{a(z - z_a)}{2(z_m - z_a)} \right] \frac{d B_o(z)}{d z} \quad (3)$$

where K' is a constant. It will be apparent that, along the z-axis, the magnetic field $B_o(z)$ produced by the lenses 3, 4 is generally parallel to the z-axis and has no other components. As is disclosed in U.S. Pat. No. 4,376,249 which is incorporated herein by reference, for small values of the radial coordinate r, the radial component of the magnetic field $B_r(z,r)$ produced by the axial field $B_z(z)$ is given approximately by Equation 4:

$$B_r(z, r) = -\frac{1}{2} K'' r \frac{d B_o(z)}{d z}, \quad (4)$$

where K" is a constant.

Equation 3 can be understood by observing that the second term (the term proportional to the first derivative of the axial magnetic field $B_o(z)$) corresponds to a magnetic field component that is opposite to the radial field component produced by the field $B_o(z)$ along the tilted axis AX'. The first term is a radial field component that, when summed with the z-directed field $B_z(z)$, produces a total magnetic field that is directed along the axis AX'.

The focus correctors 21–26 are further arranged to produce an axial field given by Equation 5:

$$B_z = K \frac{-a^2}{2(z_m - z_a)^2} \left[ B_o(z) + 3(z - z_a) \frac{d B_o(z)}{d z} + (z - z_a)^2 \frac{d^2 B_o(z)}{d z^2} \right] \quad (5)$$

where K'" is a constant. The magnetic field $B_r(z)$ of Equation 3 causes the exemplary deflected beam $EB_1$ to propagate approximately along the linear axis AX' from the lens 3 through the aperture plate 6 and to the lens 4. The magnetic field $B_z(z)$ of Equation 5 corrects the focus. The radial coordinate $r_{AX'}$ of the axis AX' as a function of the coordinate z is given by Equation 6:

$$r_{AX'} = \frac{a(z - z_a)}{z_m - z_a} \quad (6)$$

The deflectors 11–16 therefore deflect the electron beam EB so that the exemplary beam $EB_1$ propagates parallel to and along the axis AX' from the deflector 61 to the deflector 62. The magnetic field on the axis AX' is approximately equal in magnitude to the magnetic field on the axis AX of the lenses 3, 4 in the absence of the deflectors 11–16. Consequently, aberrations are smaller than in conventional apparatus such as the apparatus of FIG. 4.

In addition, providing a magnetic field according to Equation 3 with the deflectors 11–16 permits selection of the angle at which the beam EB propagates through the aperture 6 and is incident to the substrate 5. As is apparent from FIG. 1, the exemplary beams $EB_1$, $EB_2$, $EB_3$ are not perpendicularly incident to the mask 1. Similarly, the exemplary beams $EB_1$, $EB_2$, $EB_3$ are not perpendicularly incident to the substrate 5. As a result, surface irregularities on the substrate 5 can cause the image of the subfield 1a to be mispositioned or distorted. By planarizing the substrate 5 with chemical-mechanical polishing or other planarization method, the surface irregularities are reduced so that any mispositioning of the image of the subfield 1a is acceptably small. Therefore, even if the deflected exemplary beams $EB_1$, $EB_2$, $EB_3$ are not perpendicularly incident to the mask 1 and the substrate 5, a satisfactory image of the subfield 1a is produced.

The angle at which the beam EB is incident to the mask 1 is determined by the deflector 51. The angle of the axis AX' with respect to the axis AX is determined by the deflectors 61, 62. Therefore, the orientation of the axis AX' can be different than the angle at which the mask 1 is irradiated.

Figure 2A:
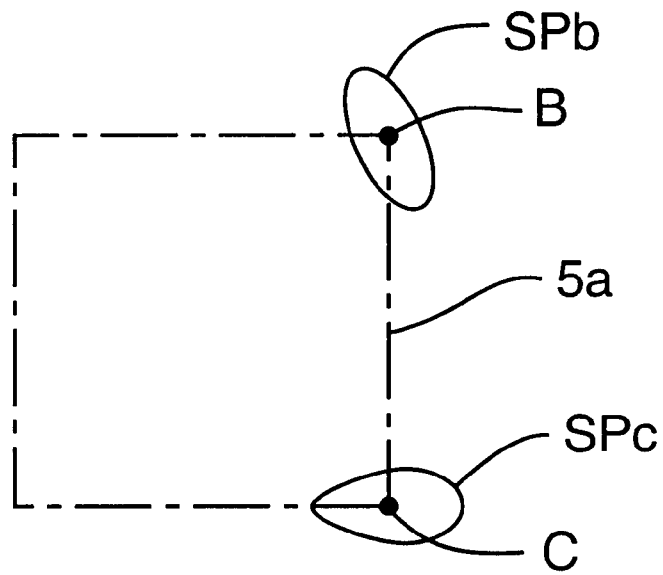
FIG. 2(a) illustrates anisotropic aberrations produced by a conventional charged-particle beam pattern transfer apparatus.

Conventional electron-beam lithographic apparatus exhibit anisotropic aberrations such as coma and astigmatism. The anisotropic aberrations cause the portion of the electron beam EB transmitted by a single point on the mask 1 to arrive at the sensitized substrate 5 spread out over a region. With reference to FIG. 2(a), a conventional apparatus images a mask subfield onto a corresponding transfer subfield 5a of the substrate. Points B, C correspond to ideal image points on the substrate of corresponding points on the respective mask subfield. Electrons arrive at the transfer subfield 5a in blur regions SPb, SPc, from respective points on the mask corresponding to the points B, C. It will be readily apparent from FIG. 2(a) that the size and orientation of the blur regions SPb, SPc depend on the orientation of the respective subfield.

Figure 2B:
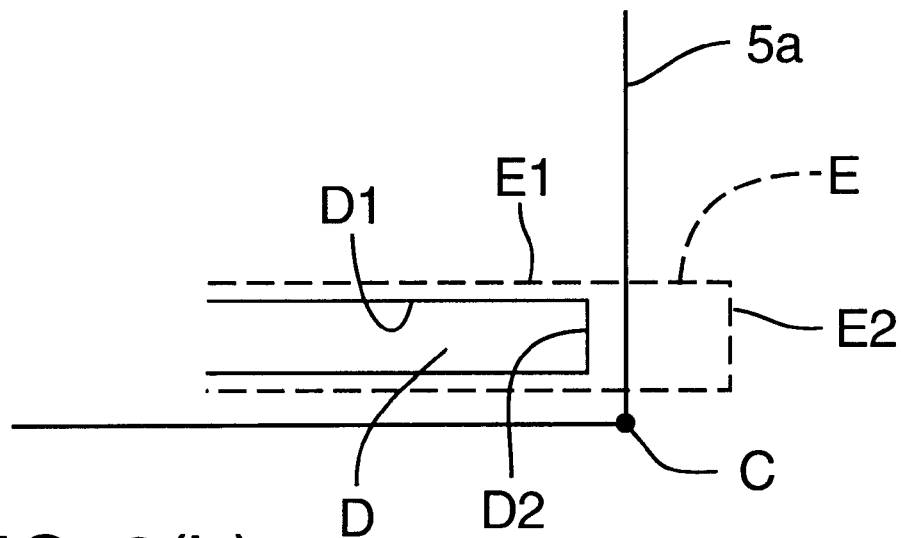
FIG. 2(b) illustrates the effect of the anisotropic aberrations of FIG. 3(a) on an image of an exemplary pattern feature.

With reference to FIG. 2(b), the mask subfield contains an exemplary rectangular pattern that, in the absence of aberrations, is imaged onto the respective transfer subfield 5a as a rectangular pattern D located near the point C. The actual image is an aberrated image E. Edges D1, D2 of the ideal image D are blurred and extend to the edges E1, E2, respectively. The edge D1 of the ideal image is then less blurred than the edge D2.

If a similar rectangular pattern on the mask subfield is imaged onto the substrate near the point B of FIG. 2(a), then the size and orientation of the image blur are different. With reference to FIGS. 2(a)–2(b), edges of the image near the point B that are parallel to the edge D1 have a larger blur than edges of the image parallel to the edge D2 because the blur region SPb extends a longer distance in direction perpendicular to D1 than in a direction perpendicular to D2.

The pattern-transfer apparatus of the present invention keeps such blurs small even for large deflections of the beam EB. Anisotropic aberrations such as astigmatism and coma are reduced so that image blur is small and has little directional dependence.

The first deflector 61 is preferably placed so that a most mask-wise principal deflection plane $61_p$ of the first deflector 61 is an axial distance $z_{61}$ from the mask 1. The plane $61_p$ is mask-wise of a most mask-wise principal plane $3_p$ of the lens 3, wherein the principal plane $3_p$ is spaced a distance $Z_3$ from the mask, and $Z_3 > Z_{61}$. The second deflector 62 is placed so that a most substrate-wise principal deflection plane $62_p$ of the second deflector 62 is substrate-wise of a most substrate-wise principal plane $4_p$ of the lens 4. Superior results are obtained if $z_{61} < |z_3 - z_{61}|$.

When the beam $EB_1$ propagates linearly along the axis AX' from the mask 1 to the substrate 5, the magnetic field along the axis AX' is approximately equal to the magnetic field $B_o(z)$ on the axis AX and the size of the deflection aberrations will be correspondingly small. In particular, coma and astigmatism can be reduced significantly. Furthermore, image errors produced because the beam EB is not perpendicularly incident to the mask 1 or the substrate 5 are controlled or eliminated by using substrates 5 having planarized surfaces.

The first deflector 61 is preferably placed close to the mask 1 so that the beam EB propagates along the axis AX' for a large distance. The second deflector 62 is preferably placed close to the substrate 5 so that the beam propagates along the axis AX' for a large distance. The deflection unit (deflectors 11–16) produces a magnetic field so that the beam EB propagates along the axis AX' from the first deflector 61 to the second deflector 62. Such a magnetic field reduces deflection aberrations even if the mask 1 and the substrate 5 are displaced from the axis AX.

Example Embodiment 2

Figure 3:
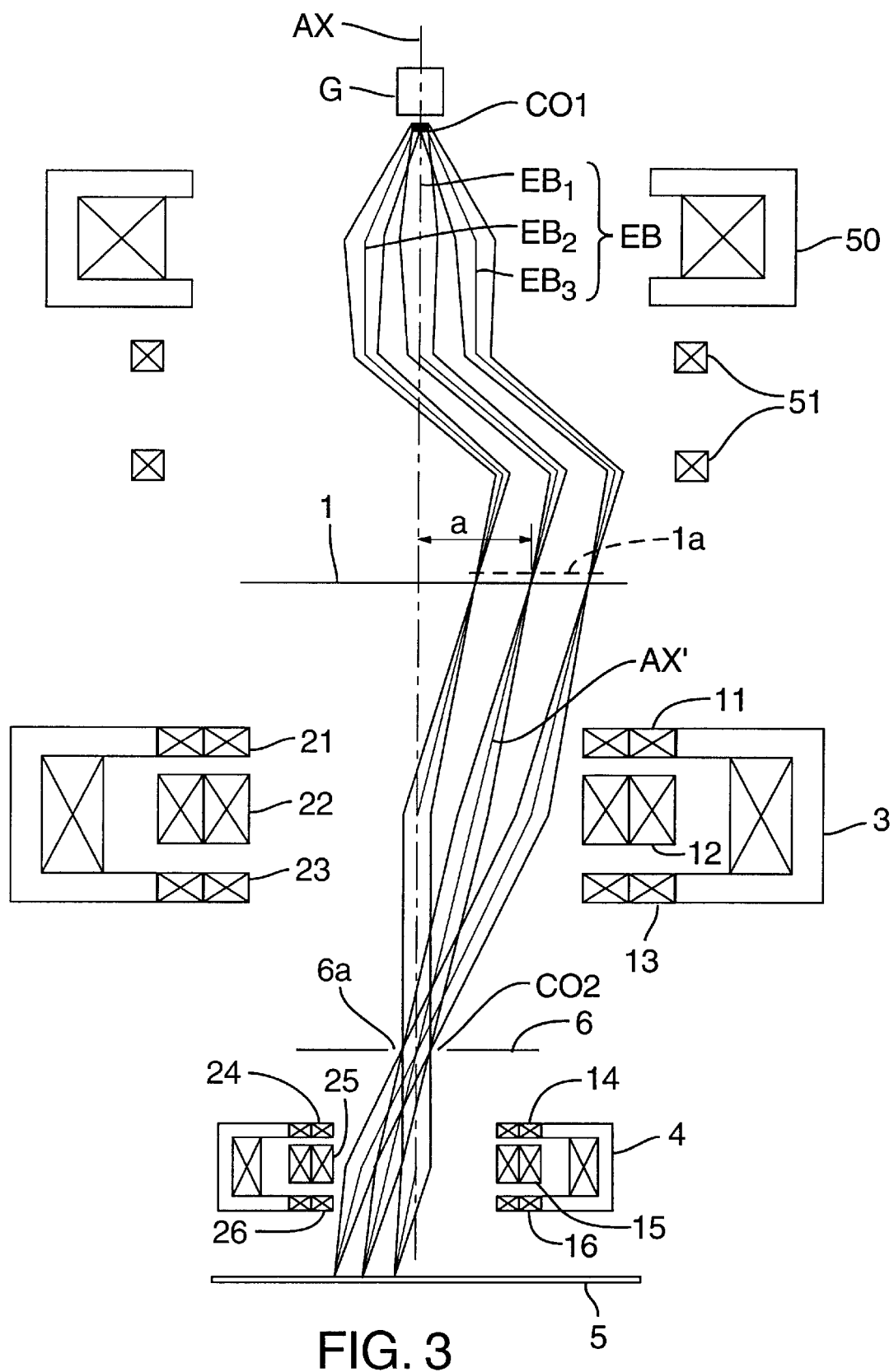
FIG. 3 is an elevational sectional view of a charged-particle beam pattern transfer apparatus according to Example Embodiment 2 of the invention.

With reference to FIG. 3, Example Embodiment 2 of an electron-beam pattern transfer apparatus comprises an electron gun G that forms an electron beam EB. The beam EB propagates along an axis AX and forms a crossover CO1. A condenser lens 50 focuses the beam onto a subfield 1a of a mask 1. For convenience, a first position along the axis AX closer to the mask 1 than a second position is referred to herein as being "mask-wise" of the second position. In addition, FIGS. 1, 3–4 use the same reference numerals for similar components.

Irradiation deflectors 51 selectably deflect the electron beam EB. Exemplary portions $EB_1$, $EB_2$, $EB_3$ of the electron beam EB are deflected away from the axis AX and then toward the axis AX by the deflectors 51 and irradiate a subfield 1a of a mask 1. For convenience, the exemplary portions $EB_1$, $EB_2$, $EB_3$ are referred to herein as beams $EB_1$, $EB_2$, $EB_3$, respectively. The beam $EB_1$ irradiates a central region of the subfield 1a that is a distance a from the axis AX while the beams $EB_2$, $EB_3$ irradiate perimeter regions of the subfield 1a.

From the mask 1, the beam EB propagates to a projection lens 3 that focuses the beam EB to a crossover CO2 at an aperture plate 6. The beam then propagates to a lens 4 that images the irradiated portion of the subfield 1a onto a sensitized substrate 5. For convenience, a first position along the axis AX closer to the substrate 5 than a second position is referred to herein as being "substrate-wise" of the second position.

Focus correctors 21, 22, 23 are placed in proximity to the lens 3. A deflection unit is provided that comprises deflectors 11–16. The deflectors 11–13 are placed in proximity to the lens 3 while the deflectors 14–16 are placed in proximity to the lens 4. Focus correctors 24, 25, 26 are placed in proximity to the lens 4. The deflection unit (i.e., deflectors 11–16) deflects the beam EB so that the exemplary beam $EB_1$ propagates along an axis AX' from the mask 1 to the substrate 5.

The beam EB propagates from the deflectors 51 along the axis AX' to an aperture 6a in the aperture plate 6. The exemplary beam $EB_1$ propagates along the axis AX' through the lenses 3, 4. The beam EB is directed by the lens 4 to the substrate 5 and the beam EB strikes the substrate 5 at a selected angle of incidence.

The magnetic fields produced by the deflection unit and the focus correctors are described by Equations 3, 5 above. In Example Embodiment 2, the orientation of the axis AX' is determined by the deflectors 51 and is not independently adjustable as in Example Embodiment 1. The radial coordinate $r_{AX'}$ of the axis AX' as a function of the coordinate z is given by Equation 6 above.

The deflectors 11–16 deflect the beam EB so that the exemplary beam $EB_1$ propagates parallel to and along the axis AX'. The magnetic field on the axis AX' is approximately equal in magnitude to the magnetic field on the axis AX of the lenses 3, 4. Consequently, aberrations are smaller than in conventional apparatus such as the apparatus of FIG. 4.

While the pattern transfer apparatus of FIGS. 1 and 3 use an electron beam, it will be apparent that other charged-particle beams are suitable.

Having illustrated and demonstrated the principles of the invention in example embodiments, it should be apparent to those skilled in the art that these example embodiments can be modified in arrangement and detail without departing from such principles. We claim as the invention all that comes within the scope of these claims.

What is claimed is:

1. A charged-particle beam apparatus for imaging patterns on a mask onto a substrate, comprising:

a charged-particle source that produces a charged-particle beam and directs the charged-particle beam to a mask so as to irradiate a region of the mask;

a projection lens that receives the charged-particle beam from the mask and forms an image of the irradiated region of the mask on the substrate, the projection lens having a lens axis; and a deflection unit situated between the mask and the substrate, the deflection unit defining a straight-line axis and producing a magnetic field sufficient to cause the charged-particle beam to propagate along the straight-line axis from the mask to the substrate.

2. The charged-particle beam apparatus of claim 1, wherein the straight-line axis is tilted with respect to the lens axis.

3. The charged-particle beam apparatus of claim 2, wherein z is a distance from the mask along the lens axis, the lens axis and the straight-line axis intersect along the lens axis at a position $z_a$, the mask is located along the lens axis at a position $z_i$, the axial on-axis magnetic field produced by the projection lenses is $B_o(z)$, and a is the distance between the lens axis and the intersection of the straight-line axis with the mask, the magnetic field produced by the deflection unit being proportional to:

$$\left[\frac{a}{z_i - z_a}\right] B_o(z) + \left[\frac{a(z - z_a)}{2(z_i - z_a)}\right] \frac{d B_o(z)}{dz}.$$

4. The charged-particle beam apparatus of claim 3, further comprising a focus corrector situated between the mask and the substrate and that produces a magnetic field proportional to:

$$\frac{-a^2}{2(z_i - z_a)^2}\left[B_o(z) + 3(z - z_a)\frac{d B_o(z)}{dz} + (z - z_a)^2 \frac{d^2 B_o(z)}{dz^2}\right].$$

5. The charged-particle beam apparatus of claim 4, further comprising an irradiation deflector situated so as to deflect the beam to the mask.

6. The charged-particle beam apparatus of claim 4, further comprising an irradiation deflector situated so as to deflect the beam so that the beam is incident at an angle to the mask and incident at the same angle to the substrate.

7. The charged-particle beam apparatus of claim 1, further comprising an irradiation deflector situated so as to deflect the beam to the mask.

8. The charged-particle beam apparatus of claim 1, further comprising an irradiation deflector situated so as to deflect the beam so that the beam is incident at an angle to the mask and incident at the same angle to the substrate.

9. The charged-particle beam apparatus of claim 1, wherein z is a distance from the mask along the lens axis, the lens axis and the straight-line axis intersect along the lens axis at a position $z_a$, the mask is located along the lens axis at a position $z_i$, the axial on-axis magnetic field produced by the projection lenses is $B_o(z)$, and a is the distance between the lens axis and the intersection of the straight-line axis with the mask, the magnetic field produced by the deflection unit being proportional to:

$$\left[\frac{a}{z_i - z_a}\right] B_o(z) + \left[\frac{a(z - z_a)}{2(z_i - z_a)}\right] \frac{d B_o(z)}{d z}.$$

10. The charged-particle beam apparatus of claim 9, further comprising an irradiation deflector situated so as to deflect the beam so that the charged-particle beam is incident to the mask at the same angle at which the beam is incident to the substrate.

11. The charged-particle beam apparatus of claim 9, further comprising a focus corrector situated between the mask and the substrate and that produces a magnetic field proportional to:

$$\frac{-a^2}{2(z_i - z_a)^2}\left[B_o(z) + 3(z - z_a)\frac{d B_o(z)}{d z} + (z - z_a)^2 \frac{d^2 B_o(z)}{d z^2}\right].$$

12. The charged-particle beam apparatus of claim 11, further comprising an irradiation deflector situated so as to deflect the charged-particle beam so that the charged-particle beam is incident to the mask at the same angle at which the beam is incident to the substrate.

13. A charged-particle beam apparatus for imaging patterns on a mask onto a substrate, comprising:
   a charged-particle source that produces a charged-particle beam and directs the charged-particle beam to a mask so as to irradiate a region of the mask;
   a projection lens that receives the charged-particle beam from the mask and forms an image of the irradiated region of the mask on the substrate, the projection lens having a lens axis;
   a deflection unit defining a straight-line axis and producing a magnetic field sufficient to cause the charged-particle beam to propagate along the straight-line axis from the mask to the substrate; and
   a second deflector situated between the projection lens and the substrate so as to deflect the charged-particle beam away from the straight-line axis to the substrate.

14. The charged-particle beam apparatus of claim 13, wherein the straight-line axis is tilted with respect to the lens axis.

15. The charged-particle beam apparatus of claim 13, wherein the charged-particle beam propagates along the straight-line axis from the mask to the second deflector.

16. The charged-particle beam apparatus of claim 13, further comprising a first deflector situated between the mask and the projection lens so as to deflect the beam along the straight-line axis.

17. The charged-particle beam apparatus of claim 16, wherein the charged-particle beam propagates along the straight-line axis from the first deflector to the second deflector.

18. The charged-particle beam apparatus of claim 17, wherein the first deflector has a principal deflection plane a distance $z_{1d}$ from the mask, the projection lens has a most mask-wise principal plane a distance $z_{lens}$ from the principal deflection plane of the first deflector, and wherein $z_{1d} < z_{lens}$.

19. The charged-particle beam apparatus of claim 18, wherein z is a distance from the mask along the lens axis, the lens axis and the straight-line axis intersect along the lens axis at a position $z_a$, the mask is located along the lens axis at a position $z_i$, the axial on-axis magnetic field produced by the projection lenses is $B_o(z)$, and a is the distance between the lens axis and the intersection of the straight-line axis with the mask, the magnetic field produced by the deflection unit being proportional to:

$$\left[\frac{a}{z_i - z_a}\right] B_o(z) + \left[\frac{a(z - z_a)}{2(z_i - z_a)}\right] \frac{d B_o(z)}{d z}.$$

20. The charged-particle beam apparatus of claim 19, further comprising a focus corrector situated between the mask and the substrate and that produces a magnetic field proportional to:

$$\frac{-a^2}{2(z_i - z_a)^2}\left[B_o(z) + 3(z - z_a)\frac{d B_o(z)}{d z} + (z - z_a)^2 \frac{d^2 B_o(z)}{d z^2}\right].$$

21. The charged-particle beam apparatus of claim 13, wherein z is a distance from the mask along the lens axis, the lens axis and the straight-line axis intersect along the lens axis at a position $z_a$, the mask is located along the lens axis at a position $z_i$, the axial on-axis magnetic field produced by the projection lenses is $B_o(z)$, and a is the distance between the lens axis and the intersection of the straight-line axis with the mask, the magnetic field produced by the deflection unit being proportional to:

$$\left[\frac{a}{z_i - z_a}\right] B_o(z) + \left[\frac{a(z - z_a)}{2(z_i - z_a)}\right] \frac{d B_o(z)}{d z}.$$

22. The charged-particle beam apparatus of claim 21, further comprising a focus corrector situated between the mask and the substrate and that produces a magnetic field proportional to:

$$\frac{-a^2}{2(z_i - z_a)^2}\left[B_o(z) + 3(z - z_a)\frac{d B_o(z)}{d z} + (z - z_a)^2 \frac{d^2 B_o(z)}{d z^2}\right].$$

23. A charged-particle optical system for deflecting a charged-particle beam transmitted by a mask to a substrate, comprising:
   a first deflector situated so as to receive the charged-particle beam from the mask;
   a projection lens situated substrate-wise of the first deflector so as to image the mask onto the substrate;
   a second deflector situated so as to receive and deflect the beam received from the projection lens; and
   a deflection unit situated between the mask and the substrate so as to produce a magnetic field such that the beam propagates along a straight line from the first deflector to the second deflector.

24. The charged-particle beam optical system of claim 23 wherein the second deflector comprises a principal deflection plane that is substrate-wise of a most substrate-wise principal plane of the projection lens.

25. The charged-particle beam optical system of claim 24, wherein the first deflector comprises a principal deflection plane located between the mask and a most mask-wise principal plane of the projection lens.

26. The charged-particle beam optical system of claim 25, wherein the second deflector comprises a principal deflection plane that is substrate-wise of a most substrate-wise principal plane of the projection lens.

27. A method for imaging patterns from a mask onto a substrate, comprising:

irradiating the mask with a charged-particle beam;

forming an image of the mask on the substrate; and providing a magnetic field sufficient to cause the beam to propagate along a straight-line axis from the mask to the substrate.

28. A charged-particle beam apparatus for imaging patterns on a mask onto a substrate, comprising:

a charged-particle source that produces a charged-particle beam and directs the charged-particle beam to a mask so as to irradiate a region of the mask;

a projection lens that receives the charged-particle beam from the mask and forms an image of the irradiated region of the mask on the substrate, the projection lens having a lens axis;

a deflection unit defining a straight-line axis and that produces a magnetic field so that the charged-particle beam propagates along the straight-line axis from the mask to the substrate, wherein the straight-line axis is tilted with respect to the lens axis, z is a distance from the mask along the lens axis, the lens axis and the straight-line axis intersect along the lens axis at a position $z_a$, the mask is located along the lens axis at a position $z_i$, the axial on-axis magnetic field produced by the projection lenses is $B_o(z)$, and a is the distance between the lens axis and the intersection of the straight-line axis with the mask, the magnetic field produced by the deflection unit being proportional to:

$$\left[\frac{a}{z_i - z_a}\right] B_o(z) + \left[\frac{a(z - z_a)}{2(z_i - z_a)}\right] \frac{d B_o(z)}{d z};$$

a focus corrector situated between the mask and the substrate and that produces a magnetic field proportional to:

$$\frac{-a^2}{2(z_i - z_a)^2}\left[B_o(z) + 3(z - z_a)\frac{d B_o(z)}{d z} + (z - z_a)^2 \frac{d^2 B_o(z)}{d z^2}\right];$$

a first deflector situated between the mask and the projection lens so as to deflect the beam along the straight-line axis; and a second deflector situated between the projection lens and the substrate so as to deflect the charged-particle beam away from the straight-line axis to the substrate, wherein the charged-particle beam propagates along the straight-line axis from the first deflector to the second deflector.

\* \* \* \* \*

UNITED STATES PATENT AND TRADEMARK OFFICE
CERTIFICATE OF CORRECTION

PATENT NO. : 6,060,711
DATED : May 9, 2000
INVENTOR(S) : Hiroyasu Shimizu

It is certified that error appears in the above-identified patent and that said Letters Patent is hereby corrected as shown below:

Col. 1, line 53, "by" should be deleted.

Col. 2, line 12, "$B_{zVAl}$" should read -- $B_{zVAL}$ --.

Col. 3, line 2, "as to a" should read -- as to --.

Col. 5, line 39, that part of Equation 5 reading "K" -- should read – K''' --.

Col. 6, line 46, "in direction" should read --in a direction --.

Col. 7, line 34, "distance a from" should read -- distance from --.

Signed and Sealed this

Twenty-second Day of May, 2001

NICHOLAS P. GODICI

*Attest:*

*Attesting Officer*  Acting Director of the United States Patent and Trademark Office